United States Patent [19]

Yamamura

[11] Patent Number: 4,672,151
[45] Date of Patent: Jun. 9, 1987

[54] PACKAGE FOR A MICROWAVE SEMICONDUCTOR DEVICE

[75] Inventor: Shigeyuki Yamamura, Sagamihara, Japan

[73] Assignee: Fujitsu Limited, Kawasaki, Japan

[21] Appl. No.: 781,788

[22] Filed: Sep. 30, 1985

[30] Foreign Application Priority Data

Oct. 8, 1984 [JP] Japan ................................. 59-210974

[51] Int. Cl.$^4$ ............................................. H01L 23/48
[52] U.S. Cl. .................................... 174/52 FP; 357/74
[58] Field of Search ...................... 174/52 FP; 357/74; 333/247

[56] References Cited

U.S. PATENT DOCUMENTS 4,427,991 1/1984 Yamamura et al. ................... 357/74

FOREIGN PATENT DOCUMENTS 0110997 6/1984 European Pat. Off. .
2513012 3/1983 France .
55-91849 7/1980 Japan ................................. 357/74 C
59-4145 1/1984 Japan ................................. 357/74 C 1492015 11/1977 United Kingdom .

*Primary Examiner*—Arthur T. Grimley
*Assistant Examiner*—D. A. Tone
*Attorney, Agent, or Firm*—Staas & Halsey

[57] ABSTRACT

A package for a microwave semiconductor device or circuit is provided having an electrical terminal suitable to cascade connection. The package includes a metallic container for the semiconductor device or circuit and a single electrical terminal having a plurality of strip lines formed thereon. The electrical terminal is composed of an insulating material base on which the strip lines are formed in parallel relationship and a plurality of insulating material block members disposed on the insulating material base so as to cover the middle portions of corresponding strip lines. The insulating material base and block members are sintered to form a unified body. The electrical terminal thus obtained is engaged in a through-hole formed in the side wall portion of the metallic container so that the strip lines penetrate perpendicular to the side wall portion, and is then, hermetically sealed to the container.

12 Claims, 18 Drawing Figures

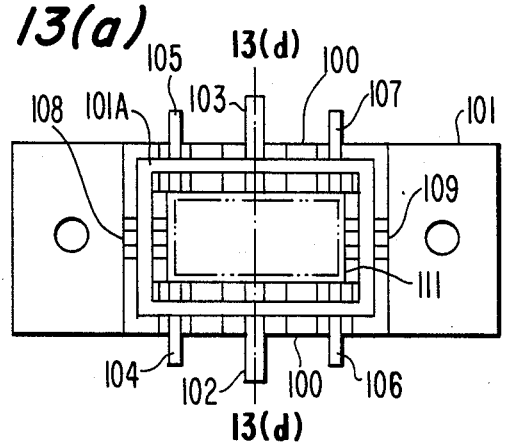
FIG. 13(a)
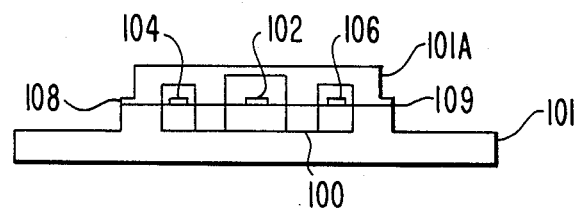
FIG. 13(b)
FIG. 13(d)
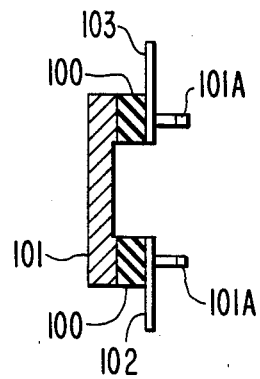
FIG. 13(c)
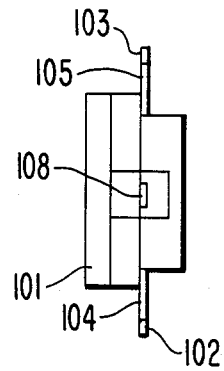
FIG. 14
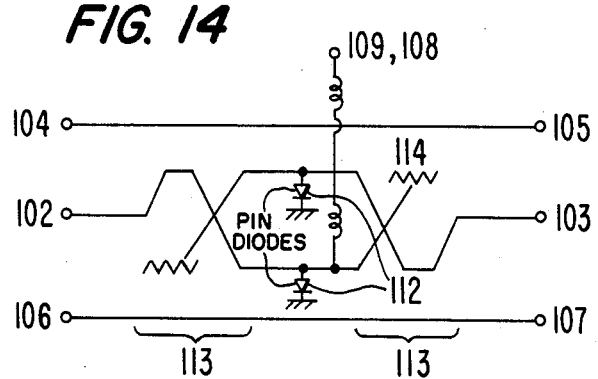

PACKAGE FOR A MICROWAVE SEMICONDUCTOR DEVICE

BACKGROUND OF THE INVENTION

The present invention relates to a semiconductor device used in microwave circuits or high-speed digital circuits, and, more specifically, to an improvement in a package for the semiconductor devices, suitable to cascade connection.

Solid-state microwave devices, such as GaAs-FETs (gallium arsenide Field Effect Transistors) have been used in wide-band amplifiers for communication equipment or a booster amplifier for a voltage-controlled oscillator operated in a microwave frequency band ranging from 2 GHz to 30 GHz or higher. In the band, packaging design for such a GaAs-FET must be performed on the basis of a concept different from transistors or ICs (Integrated Circuits) which are operated in the relatively low frequency bands, since the dimensions of the package become close to the wave length of a microwave signal. For instance, 3 cm for the wave length signal of 10 GHz.

The inventor has described packages for a semiconductor device used in 2 to 30 GHz band in co-pending U.S. application Ser. Nos. 571,542 and 708,609. The packages described in these applications, comprise a metallic container for a semiconductor device or circuit housed therein, which are intended to solve the problems occurring in prior art packages comprising a ceramic container at such a high frequency band. That is, the ceramic container has undesirable influences which become remarkable when the semiconductor device or circuit housed therein is operated at a microwave frequency band. For instance, a ring-shaped metallized layer formed on a ceramic container, which is for attaching a lid thereon, would function as a resonator, thereby establishing an apparent oscillation circuit in conjunction with the parasitic capacitance relating to the ceramic container. In a practical package, the oscillation frequency defined by the inductance of the ring-shaped metallized layer and the parasitic capacitance usually matches a microwave frequency in the band, therefore, the effective frequency band allowed for the semiconductor device or circuit is inevitably narrowed. Other kinds of problems relating to such a ceramic container have been described in the specifications of the above U.S. applications.

The package described above comprising a metallic container can be free from problems including the above-mentioned oscillation characteristic of the ceramic container. However, different problems arise from the insufficient positional accuracy of input/output terminals provided on a metallic package. In each package, the input/output terminal having a strip line is hermetically sealed to the metallic container in separated relationship such that each of the strip lines is electrically isolated from the metallic container. The terminals are apt to deviate from their respective designated positions on the metallic container during the hermetic sealing process. Poor positional accuracy of the terminals results in an unfavorable bonding between the packages in a cascade connection. Such unfavorable bonding includes, for example, the increase in the length of the bonding ribbons interconnecting, respectively, corresponding terminals on the cascaded packages, and a step involved between the strip line and the bonding ribbon. These structural failures in the bonding cause impedance mismatch and result in the degradation of high-frequency characteristics of the circuit comprising the packages. These problems in the above-described package will be further discussed later with reference to the related drawings herein.

SUMMARY OF THE INVENTION

It is an object of the present invention to provide a package for a semiconductor device or circuit operated in a microwave frequency band or operated to switch high-speed digital signals.

It is another object of the present invention to provide a package suitable to cascade connection of semiconductor devices or circuits operated in a microwave frequency band or those operated to switch high-speed digital signals.

The above objects can be attained by providing a package for a semiconductor device or circuit including: a metallic container; and a signal electrical terminal means, wherein the metallic container has a metallic base portion and a metallic side wall portion in which a through-hole is formed to engage therein the electrical terminal means which is secured to the metallic container. The through-hole has cutout portions successively formed on an edge thereof to leave a corresponding tooth portion consisting of a part of the side wall portion therebetween. The electrical terminal means includes an insulating material base portion having a surface bonded to the metallic base portion and a plurality of insulating material block members, each of which has a surface bonded to a corresponding one of the cutout portions of the through-hole. The insulating material base has a plurality of strip lines formed thereon in parallel relationship which penetrate the side wall portion perpendicularly. Each of the strip lines has a width in a direction perpendicular to the extension thereof. Each of the insulating material block members has a width larger than the width of the strip lines has a depth substantially equal to the thickness of the side wall and is combined with the insulating material base so as to selectively cover the corresponding one of the strip lines with another surface thereof defined by the width and depth.

BRIEF DESCRIPTION OF THE DRAWINGS

Other objects and aspects of the invention will become apparent from the following description of the preferred embodiments with reference to the accompanying drawings, in which:

FIGS. 13(a), 13(b) and 13(c) are, respectively, a plan view, a front view and a side view of another embodiment of the present invention;

FIG. 13(d) is a cross-section taken along line 13(d)—13(d) in FIG. 13(a); and

FIG. 14 is an equivalent circuit diagram of the circuit contained in the package shown in FIG. 13(a).

DETAILED DESCRIPTION OF THE PREFERRED EMBODIMENTS

For appreciating better the improvements and advantages afforded by the package of the present invention as disclosed herein, there is first described, with reference to FIGS. 5 to 11, the inventor's earlier package structures as disclosed in the aforesaid U.S. applications.

Figure 5:
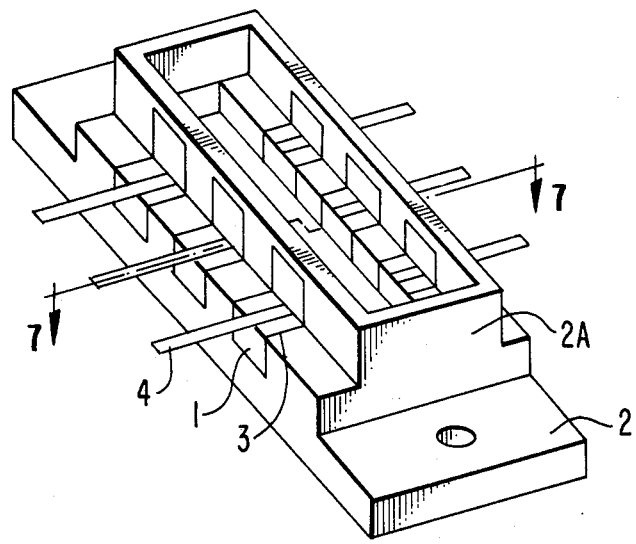
FIG. 5 is a perspective view illustrating the inventor's earlier design for a package for a semiconductor device or circuit operated in the microwave frequency band.

FIG. 5 is a perspective view illustrating the inventor's earlier design for a package for a semiconductor device or circuit operated in a microwave frequency band. Referring to FIG. 5, the package comprises: electrical terminal means 1; a metallic base portion 2 formed of copper, for instance, the metallic base portion 2 having a side wall portion 2A formed thereon on which three separated through-holes 3 are formed; and lead tabs 4 bonded to the corresponding strip lines to be described later. In the package of FIG. 5, three of the electrical terminal means 1 are provided on each of the opposite side walls of the side wall portion 2A.

Figure 6:
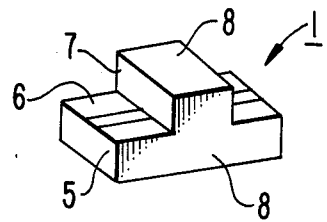
FIG. 6 is a perspective view illustrating the detailed structure of an electrical terminal means shown in FIG. 5.

FIG. 6 is a perspective view for illustrating the detailed structure of the electrical terminal means 1. As shown in FIG. 6, each of the electrical terminal means 1 comprises: an insulating material base 5 composed of alumina, for example; a strip line 6 of tungsten, for example, printed on the upper surface of the insulating material base 5; and an insulating material block member 7 composed of alumina, for example, which is disposed on the insulating material base 5 so as to cover the middle portion of the strip line 6. The insulating material base 5 and block member 7 are sintered to form a unified body. Further, a metallized layer 8 is formed to cover the respective opposite side surfaces of the insulating material base 5 and block member 7 and the upper surface of the latter as shown in FIG. 6. The bottom surface (not shown) of the insulating material base 5 is also coated with the metallized layer 8.

Figure 7:
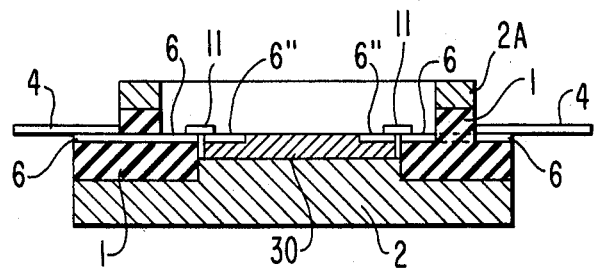
FIG. 7 is a cross-section taken along line 7—7' in FIG. 5.

Such electrical terminal means 1 is engaged in the through-hole 3 and secured to the metallic side wall portion 2A, as shown in FIG. 7 which is a cross-section taken along line 7—17' in FIG. 5. In FIG. 7, like references designate like or corresponding parts shown in FIG. 5. For establishing a hermetically sealed condition, the electrical terminal means 1 and the metallic side wall portion 2A are brazed together with a silver solder, for example. The exposed surface of the strip line 6 is plated with gold (Au) after the completion of the brazing process. The lead tabs 4 are for connecting the strip lines 6 to corresponding external wirings (not shown). In FIG. 7, reference 30 designates a semiconductor device such as a balanced amplifier housed in the package and reference 6" designates a strip line formed on the semiconductor device 30, which is connected to a corresponding strip line 6 with bonding lead 11. The above-described package configuration shown in FIG. 5 has the advantages described below.

(1) As mentioned before, undesirable oscillation in the microwave frequency band is caused in a package having a ceramic container due to the inductance involved by the ring-shaped metallized layer formed on the upper surface of the ceramic container for attaching a lid thereon. However, in a package comprising a metallic container as shown in FIG. 5, such undesirable oscillation is prevented even when a ceramic lid having a metallized layer formed thereon is attached to the metallic container, hence, desirable frequency characteristics can be obtained.

(2) In the package shown in FIG. 5, the connection to the external circuit can be performed with strip lines. Since strip line mode wiring is usually employed for the internal circuitry of the package, there is no need for transmission mode conversion between packages connected in cascade relationship by using strip lines. This means that high-frequency characteristic degradation due to the discontinuity in the mode conversion of a transmission signal between the packages can be avoided when an input or output signal line of a package is wired with a strip line.

(3) Further, in the package of FIG. 5, the adjacent strip lines 6 are electrically isolated from each other by the metallic side wall portion which is kept at ground potential, hence, the coupling of the strip lines at high frequency can be prevented.

Exemplary dimensions of the electrical terminal means 1 as shown in FIG. 6 include: 1.2 mm for the height from the bottom surface of the insulating material base 5 to the upper surface of the insulating material block member 7: 0.5 mm and 1 mm for the respective lengths of the insulating material block member 7 and insulating material base 5 in the direction along the extension of the strip line 6; and 0.3 mm and 1.2 mm for the respective widths of the strip line 6 and the insulating material base 5.

Figure 8:
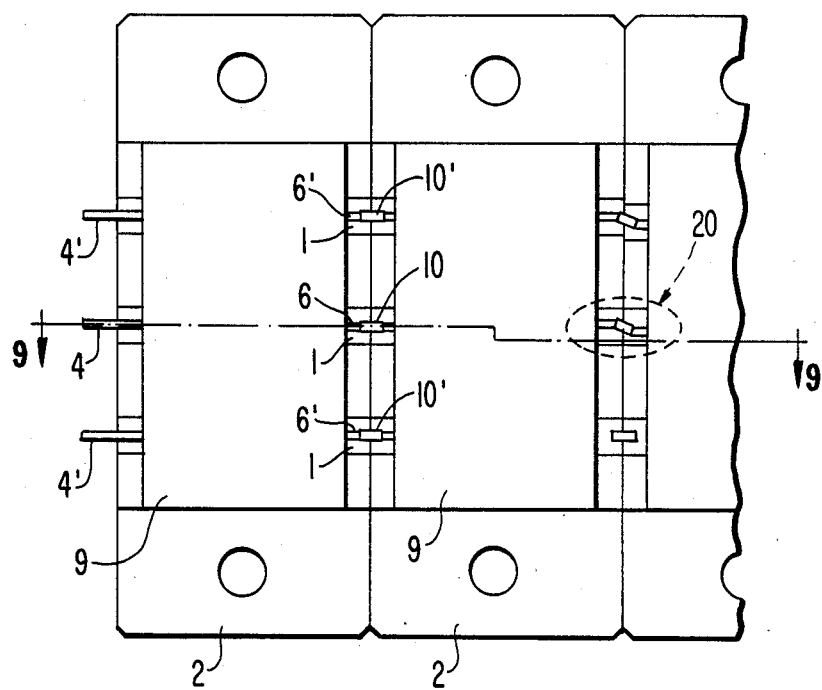
FIG. 8 is a plan view illustrating plural packages as shown in FIG. 5 in cascade connection.
Figure 9:
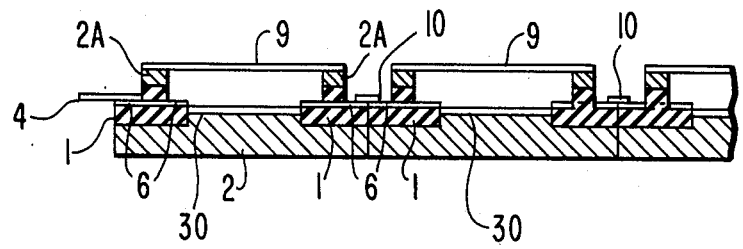
FIG. 9 is a cross-section taken along line 8—8' in FIG. 8.

FIG. 8 is a plan view illustrating plural packages connected in cascade relationship, wherein each of the packages has a structure as shown in FIG. 5. FIG. 9 is a cross-section taken along line 8—8' in FIG. 8. In FIGS. 8 and 9, like references designate like or corresponding parts in the preceding drawings. Referring to FIGS. 8 and 9, each package is provided with a lid 9 attached to the top of the metallic sidewall 2A. Corresponding abutting strip lines 6 or 6' of neighboring packages are interconnected with a corresponding bonding ribbon 10 or 10' of gold, for example, wherein the stip lines 6 and ribbon 10 are relevant to those for signal lines, and the strip lines 6' and ribbon 10' are relevant to those for DC voltage supplying lines. The lead tabs 4 and 4', which are also relevant to the signal lines and DC voltage supplying lines, are bonded to the corresponding outer side strip line 6 and 6' of the outermost package (the left hand side package in FIGS. 8 and 9), respectively. A semiconductor device 30, a balanced amplifier, for example, is housed in each package and electrically connected to the strip lines on the electrical terminal means 1 in the same manner as shown in FIG. 7.

In the cascade connection of the packages as shown in FIGS. 8 and 9, there is usually a portion as indicated by reference 20 in which the corresponding strip lines on the neighboring packages cannot correctly line up to each other, therefore, the bonding ribbon 10 is necessarily disposed obliquely with respect to the extension of the strip lines.

Figure 10A:
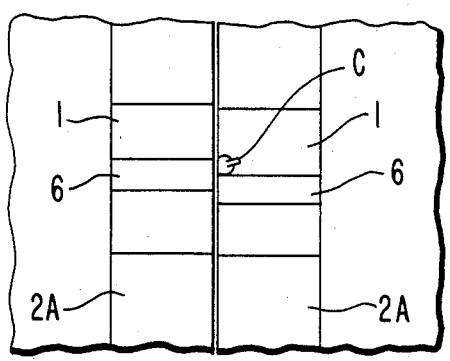
FIGS. 10(a) and 10(b) are enlarged plan views, respectively, illustrating an exemplary positional mismatch between abutting strip lines on packages in cascade connection and an obliquely disposed bonding ribbon for interconnecting the mismatched strip lines.
Figure 10B:
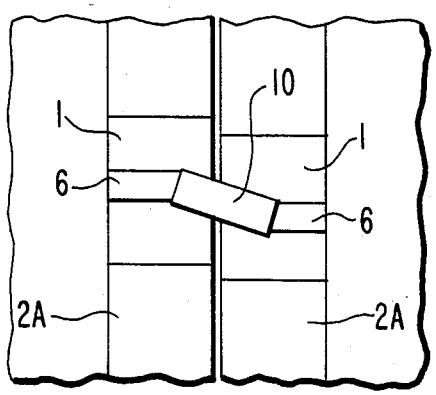

FIGS. 10(a) and 10(b) are enlarged partial plan views, respectively, illustrating an exemplary positional mismatch between abutting two strip lines of packages in cascade connection and an obliquely disposed bonding ribbon for interconnecting the mismatched abutting strip lines in the portion 20 shown in FIG. 8. In FIGS. 10(a) and 10(b), like references designate like or corresponding parts in the preceding drawings. The incorrectness in the relative positions of the strip lines is due to the deviation of the electric terminal means from the designated positions, which mainly occurs during the processes for engaging and securing the electrical terminal means to the metallic container.

In the transmission of a high-frequency signal between the packages in cascade connection, the small step at the tips of interconnected abutting strip lines 6 works to provide a parasitic capacitance C as shown in FIG. 10(a). The capacitance C is relative to the amount of the step and probably becomes the cause of an impedance mismatching which results in the high frequency characteristics degradation. This illustrates the primary significance of the positional accuracy required for the electrical terminal means 1.

The relatively-deviated abutting strip lines 6 must be connected to each other by an obliquely disposed bonding ribbon 10 so that none of the steps is produced there as shown in FIG. 10(b). However, satisfying this requirement requires elaborate and time-consuming procedures for the bonding of the ribbon 10, and the result is a low yield of products. Even when the bonding is successfully performed, the length of the bonding ribbon 10 is necessarily so large as to cause the high-frequency characteristics degradation as mentioned above. Quantitatively speaking, an increase in the length corresponding to a tenth of a quarter wave length of the high-frequency signal transmitted through the bonding ribbon 10 is assumed to have a significant influence. For instance, approximately 0.30 mm for the frequency of 10 GHz.

Figure 11:
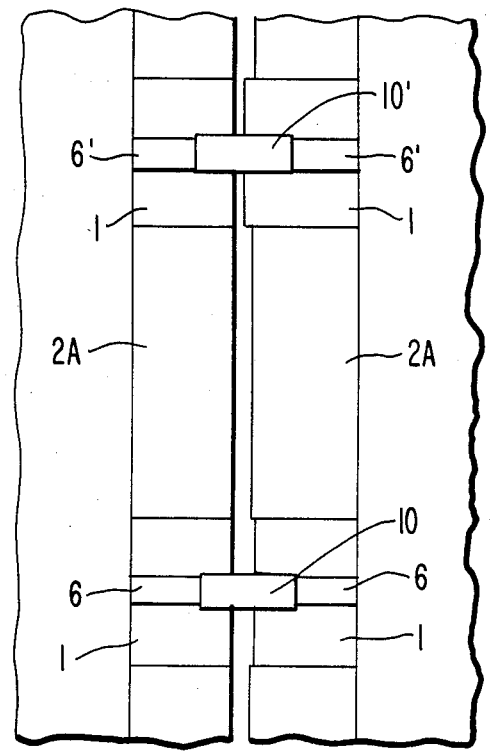
FIG. 11 is a partial plan view illustrating another type of positional deviation of electrical terminal means observed in one of the inventor's earlier package designs.

Another cause to increase the length of the bonding ribbon is explained with reference to FIG. 11 which is a partial plan view illustrating corresponding abutting electrical terminal means of two neighboring packages. In FIG. 11, like references designate like or corresponding parts in the preceding drawings. There are different conditions of the electrical terminal means 1 engaged in the corresponding through-holes in the metallic side wall portions 2A, including the deeply engaged condition as illustrated on the bottom of FIG. 11 and the shallowly engaged condition as illustrated on the top of FIG. 11. As understood from FIG. 11, if one of the engaging conditions as illustrated occurs in any one of the electrical terminal means 1 of two neighboring packages, the increase in the length of the bonding ribbons 10 between the respective corresponding terminal means 1 is inevitably effected.

The aforesaid unfavorable increase in the length of the bonding ribbons between the packages in cascade connection is eliminated by the present invention because plural strip lines formed on the single electrical terminal means of each package are correctly arranged parallel to each other with a predetermined pitch. That is, in the cascade connection of plural packages, if neighboring packages are disposed so that a pair of corresponding strip lines of the packages abut each other, the remainder of the corresponding strip lines are made spontaneously to abut each other without relative positional deviations. Thus, each pair of the corresponding strip lines is interconnected with a bonding ribbon having the same length which may be minimum in length. The advantage of the single electrical terminal means structure afforded by the present invention in solving the problem explained with reference to FIG. 11 will be described later.

Figure 1:
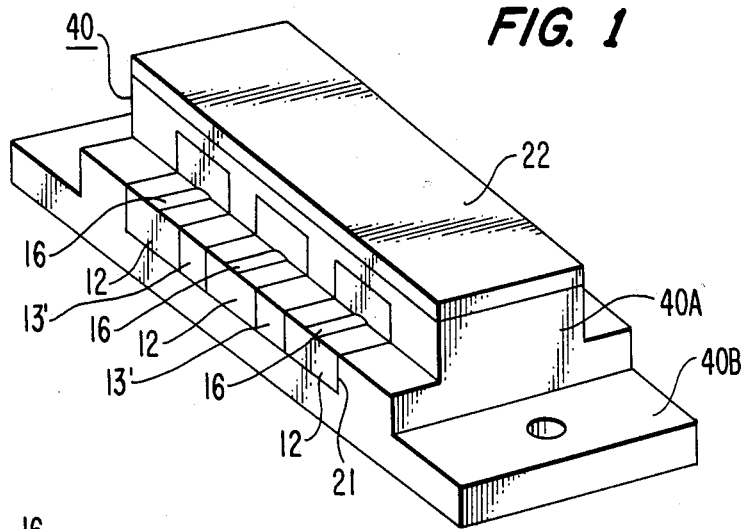
FIG. 1 a perspective view illustrating an embodiment of a package for a high-frequency semiconductor device or circuit, according to the present invention.

FIG. 1 is a perspective view illustrating an embodiment of a package for a high-frequency semiconductor device according to the present invention. Referring to FIG. 1, the package comprises a single electrical terminal means 12 and a metallic container 40 having a lid 22 attached thereon. The metallic container 40 has a metallic base portion 40B and a metallic side wall portion 40A, both formed as a unified structure. The side wall portion 40A consists of two pairs of opposite side walls having a thickness, hence, providing a space for accommodating a semiconductor device or circuit thereon. A through-hole 21 is formed in the side wall portion 40A. The single electrical terminal means 12 is engaged in the through-hole 21 and secured to the side wall portion 40A. In FIG. 1, references 13' and 16, respectively, designate a metallized layer and a strip line as explained in the following.

Figure 2:
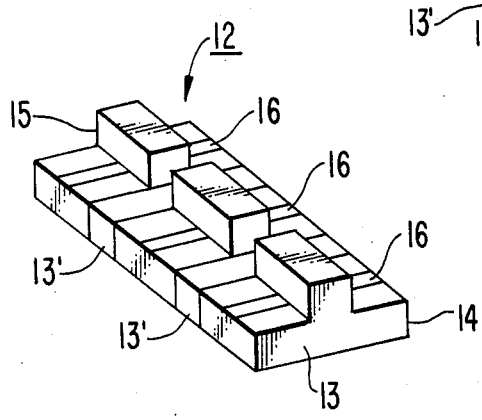
FIG. 2 is a perspective view illustrating an exemplary structure of the electrical terminal means shown in FIG. 1.

The electrical terminal means 12 has a structure as shown in the perspective view of FIG. 2. Referring to FIG. 2, the electrical terminal means 12 comprises an insulating material base 14 having a plurality of strip lines 16 formed thereon and a plurality of insulating material block members 15 covering the middle portions of corresponding strip lines 16. As understood from FIGS. 1 and 2, each of the insulating material block members 15 has a width larger than that of the strip lines 16 and a length substantially equal to the thickness of the side wall portion 40A.

The insulating material base 14 and block members 15 are combined together to form a unified body. A metallized layer 13 is formed to cover the respective opposite side surface of the insulating material base 14 and block members 15 and the respective upper surfaces of the latter. The bottom surface of the insulating material base 14 is also coated with the metallized layer. Further, belt-shaped metallized layer 13' are formed on the upper surface of the insulating material base 14 between the insulating material block members 15. The belt-shaped metallized layers 13' extend to selectively cover the opposite side surfaces of the insulating material base 14. The metallized layers 13 and 13' are formed to have electrical connections.

Figure 3:
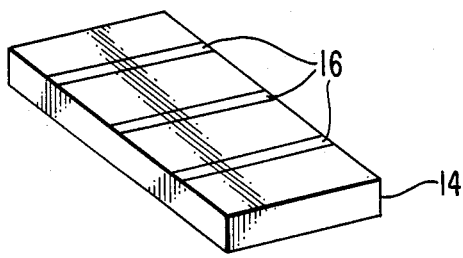
FIGS. 3 and 4 are perspective views illustrating an exemplary fabrication process of the electrical terminal means shown in FIG. 2.
Figure 4:
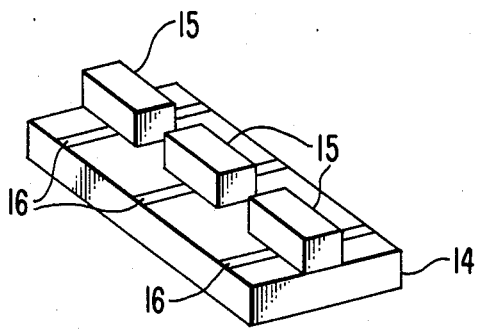

FIGS. 3 and 4 are perspective views for explaining the fabrication process for the electrical terminal means 12 shown in FIG. 2. As the raw material for the insulating material base 14, a green sheet of insulating material such as alumina is prepared by using a conventional tecnique. That is, a powder of alumina, for example, is kneaded with a binder composed of resin and solvent. The slurry of the alumina and the binder is formed into a sheet, and then, cut into a predetermined size.

As shown in FIG. 3, on the surface of the green sheet of alumina, three parallel strip lines 16, each having a width of 0.3 mm, for example, are printed by using a paste of a powdered material such as tungsten (W) or molybdenum-manganese (Mo-Mn) alloy according to a conventional thick film technology. As the insulating material block members 15 of FIG. 2, three chips of the same green sheet are cut out in a predetermined size and placed on the green sheet for the insulating material base 14 so as to cover the middle portions of corresponding strip lines 16. Then, the insulating material base 14 and block members 15 of the green sheets are sintered together with the metallic strip lines 16, and thus, formed in a unified structure as shown in FIG. 4. Subsequently, metallized layers 13 and 13' as previously shown in FIG. 2 are selectively formed on the surfaces of the insulating material base 14 and block members 15.

Exemplary dimensions of the electrical terminal means 12 after the sintering includes: 1.2 mm for the height from the bottom surface of the insulating material base 14 to the upper surface of each insulating material block member 15; 0.5 mm and 1 mm for the respective lengths of the insulating material block member 15 and the insulating material base 14 in the direction along the extension of the strip line 16; 0.3 mm and 1.2 mm for the respective widths of the strip line 6 and the insulating material block member 15; and 4.6 mm for the length of the insulating material base 14 in the direction perpendicular to the extension of the strip line 16. The arrangement spacing of the strip lines 6 is 1.7 mm, for example.

Figure 12:
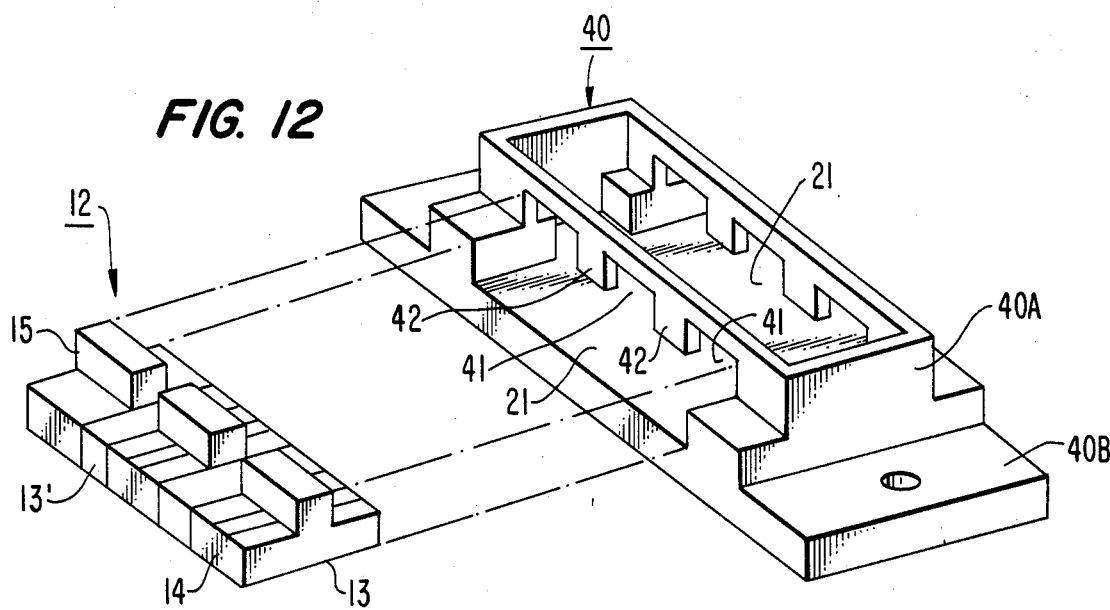
FIG. 12 is an exploded perspective view illustrating the assemblage of the metallic container and the electrical terminal means according to the present invention.

FIG. 12 is a perspective exploded view illustrating the assemblage of the metallic container 40 and electrical terminal means 12 obtained as above. As shown in FIG. 12, the through-hole 21 formed on the side wall portion 40A of container 40 has cutout portions 41 successively formed on the upper side edge thereof, thereby leaving corresponding tooth portions 42 therebetween. The electrical terminal means 12 is inserted in each through-hole 21 so that each of the insulating material block members 15 is engaged in a corresponding cutout portion 41. Accordingly, the bottom surface of the insulating material base 14 is disposed to face the metallic base portion 40B of the container 40. In the above assembled condition, the insulating material base 14 and block members 15 are, respectively, brazed via the metallized layers 13 and 13' to the metallic base portion 40B and the inner surfaces of the cutout portions 41 with silver solder, for example. Thus, a hermetic sealing is completed between the electrical terminal means 12 and the container 40.

Besides the advantage in solving the problem relating to the relative positional deviation of the separate electrical terminal means of the package shown in FIGS. 5-11, the single electrical terminal means 12 structure of the present invention package 40 has the further advantage of alleviating the problem arising from the unfavorable engaging conditions as explained with reference to FIG. 11.

In the package shown in FIG. 5, if one of the three separately formed electrical terminal means 1 is in the deep or shallow engaging condition as explained above, the package must be rejected from use in the cascade connection. In the package of the present invention, such unfavorable engaging condition can be minimized because the fabrication process control is made easy thanks to the larger-sized terminal means of the present invention compared with the package shown in FIGS. 5-11. And also, faults due to the angular deviation of the strip lines from the designated perpendicularity to the side wall can be minimized because of the same reason.

In summary, the following advantages are provided by the packages according to the present invention: (1) the relative positional accuracy between the strip lines of a package can be increased as well as an increase in the accuracy in their positions on the package, hence, the length of bonding ribbon between each of the corresponding strip lines of packages in a cascade connection can be minimized; (2) neighboring strip lines on a package are electrically isolated from each other by the corresponding tooth portions 42 therebetween of the metallic side wall portion 40A and by the metallized layer 13' provided on the surface of the insulating material base 14 between the strip lines as shown in FIG. 12, therefore, high-frequency coupling between the strip lines can be prevented. As a result, semiconductor circuits housed in the packages which are in cascade connection can operate with desired frequency characteristics.

In the above embodiment, the package comprises an electrical terminal means 12 in which a plurality of strip lines 16 are formed on a common insulating material base 14. However, another process for fabricating the electrical terminal means may be followed instead, wherein the strip lines are formed on respective separate insulating material block members which are then disposed on a common insulating material base. Although this process requires more strict control for arranging the insulating block members on the base, the positional accuracy regarding the strip lines as mentioned above can still be high compared with prior art packages. Further, in the above embodiment, the insulating material block members sould not be limited to rectangular parallelepipeds, but can be other types, for example, members having a cross-section of a semi-circle or triangle, which are disposed on the insulating material base so that the cross-section is perpendicular to the extension of the strip line, provided the corresponding cutout portions on the side wall portion are formed to fit the modified insulating material block members.

FIGS. 13(a), 13(b) and 13(c) are, respectively, a plan view, a front view and a side view of another embodiment of a package also applicable to cascade connection according to the present invention. FIG. 13(d) is a cross-section taken along line 13(d)—13(d) in FIG. 13(a). The package shown in FIG. 13(a) comprises an electrical terminal means 100 for cascade connection and auxiliary terminal means 108 and 109. The terminal means 100 is fabricated according to the same procedure as explained with reference to FIGS. 2 to 4 and secured to the metallic container 101 as shown in FIG. 12. The auxiliary terminal means 108 and 109 are fabricated according to the same procedure as the terminal means of the package explained with reference to FIGS. 5 to 6, and then, engaged in the respective through-holes formed in opposite side walls 101a of the metallic container 101.

The strip lines 102 and 103 formed on the respective terminal means 100 are for transmitting high-frequency signals and the strip lines 104, 105, 106 and 107, which are also formed on the respective terminal means 100, are for supplying DC voltages. In FIG. 13(a), reference 111 designates an internal circuit accommodated therein.

An exemplary usage of the auxiliary terminal means 108 and 109 is described in the following.

FIG. 14 is an equivalent circuit diagram of an attenuator comprising a PIN diode 112 which is accommodated in the package of FIG. 13(a). The package having the attenuator is connected to a package mounting an amplifier therein in cascade relationship as shown in FIG. 8, and operated as a variable gain control stage. The auxiliary terminal means 108 and 109 are used for controlling the loss of the high-frequency signals transmitting through the cascade connected strip lines 102 and 103 of the gain control stage, hence the gain of the amplifier stage can be changed.

For instance, when the gain must be kept constant even under the condition of temperature change, a thermistor detects the temperature, and the attenuator increases the loss since the gain of the amplifier increases if the temperature change is low. In an opposite temperature change, the attenuator decreases the loss. The change in the loss is carried out by controlling the bias voltage of the PIN diodes 112, which are supplied from the auxiliary terminal means 108 or 109.

The attenuator having the PIN diodes 112 is inserted in the transmission line in parallel relationship. When the PIN diodes 112 have a low resistivity, the impedance of the transmission line becomes low. When the resistivity becomes zero, the incoming high-frequency signals are reflected. On the contrary, when the resistivity of the PIN diodes 112 is increased, the incoming signals are permitted to be transmitted to the output side. When the resistivity is further increased, the reflection of the signals occurs again. Thus, the input power is controlled to be output.

If there is a large reflection of the incoming signals, cascade connection of amplifier stages via the attenuator stage cannot operate. Therefore, a hybrid coupler 113 is provided for each of the input and output sides of the attenuator and the reflected power is absorbed by the terminal resistors 114. As a result, even when the reflection of the incoming signals to the strip line 102 occurs in the attenuator, it does not appear on the strip line 103, hence, the output side of the attenuator is assumed to be terminated with a characteristics impedance of 50 ohms, and thus, the attenuator can be connected with the amplifier stages in a cascade relationship.

I claim:

1. A package for a semiconductor device or circuit, comprising:
   (a) a metallic container for the semiconductor device or circuit, the container having a side wall with a through-hole formed therein for connecting an inside and outside of said container; and
   (b) electrical terminal means engaged in said through-hole so as to be secured to said container, said electrical terminal means having
      (i) an insulating material base with a plurality of strip lines formed thereon in parallel relationship, and
      (ii) a plurality of insulating material block members, each of said insulating material block members being disposed on said insulating material base so as to selectively cover a corresponding strip line at a middle portion of said strip line.

2. A package for a semiconductor device or circuit, comprising:
   (a) a metallic container for the semiconductor device or circuit, including
      (i) a metallic base portion, and
      (ii) a metallic side wall portion, said side wall portion having a through-hole formed therein, said through-hole having cutput portions successively formed on an edge thereof to leave corresponding tooth portions of said side wall portion therebetween; and
   (b) a single electrical terminal means engaged in said through-hole and secured to said container, said electrical terminal means including
      (i) an insulating material base portion having a plurality of strip lines formed thereon in parallel relationship penetrating said side wall portion perpendicularly, each of said strip lines having a width in a direction perpendicularly transverse to said strip lines, said insulating material base having a surface bonded to said metallic base portion, and
      (ii) a plurality of insulating material block members having a width larger than the width of said strip lines and a depth substantially equal to the thickness of said side wall, each of said insulating material block members being secured to said insulating material base so as to selectively cover a corresponding strip line with a surface thereof defined by the width and depth, each of said insulating material block members having a surface bonded to a corresponding cutout portion.

3. A package as set forth in claim 2, wherein said insulating material base has a substantially rectangular cross-section in a plane perpendicular to the direction to which said strip lines extend.

4. A package as set forth in claim 3, wherein each of said insulating material block members has a substantially rectangular cross-section in a plane perpendicular to the direction to which said strip lines extend.

5. A package as set forth in claim 2, wherein said tooth portions are formed to extend to said insulating material base.

6. A package as set forth in claim 2, wherein each of said tooth portions is bonded to said insulating material base at a tip thereof with a width.

7. A package as set forth in claim 6, further comprising metallized layers formed on said insulating material base so as to connect said tips of said tooth portions to said metallic base portion of said container.

8. A package as set forth in claim 2, further comprising a lid secured to said container.

9. A package as set forth in claim 2, wherein said container is formed of copper.

10. A package as set forth in claim 2, wherein said insulating material base and said insulating material block members are composed of alumina.

11. A package as set forth in claim 2, wherein said electrical terminal means is hermetically sealed to said container.

12. A package as set forth in claim 11, wherein said electrical terminal means is brazed to said container.

* * * * *

UNITED STATES PATENT AND TRADEMARK OFFICE
CERTIFICATE OF CORRECTION

PATENT NO. : 4,672,151

DATED : Jun. 9, 1987

INVENTOR(S) : YAMAMURA

It is certified that error appears in the above-identified patent and that said Letters Patent is hereby corrected as shown below:

Col. 2

Line 19, delete "signal" and insert --single--.

Col. 3

Line 64, delete "7-17'" and insert --7-7--.

Col. 10

Line 10, delete "cutput" and insert --output--.

Signed and Sealed this

Fifteenth Day of December, 1987

Attest:

DONALD J. QUIGG

Attesting Officer     Commissioner of Patents and Trademarks